(12) United States Patent
Hosking et al.

(10) Patent No.: US 7,832,944 B2
(45) Date of Patent: Nov. 16, 2010

(54) OPTOELECTRONIC SUBASSEMBLY WITH INTEGRAL THERMOELECTRIC COOLER DRIVER

(75) Inventors: Lucy G. Hosking, Santa Cruz, CA (US); Henry Daghighian, Mountain View, CA (US)

(73) Assignee: Finisar Corporation, Sunnyvale, CA (US)

( * ) Notice: Subject to any disclaimer, the term of this patent is extended or adjusted under 35 U.S.C. 154(b) by 70 days.

(21) Appl. No.: 12/127,103

(22) Filed: May 27, 2008

(65) Prior Publication Data

US 2009/0122493 A1 May 14, 2009

Related U.S. Application Data

(60) Provisional application No. 60/986,356, filed on Nov. 8, 2007.

(51) Int. Cl.
*H05K 7/20* (2006.01)
*G02B 6/36* (2006.01)

(52) U.S. Cl. .................. 385/92; 372/34; 361/831; 398/139

(58) Field of Classification Search ............ 385/88–94; 398/135, 138, 139; 361/719, 831; 372/34–36
See application file for complete search history.

(56) References Cited

U.S. PATENT DOCUMENTS

| | | | |
|---|---|---|---|
| 4,604,753 A | 8/1986 | Sawai | |
| 5,187,714 A | 2/1993 | Okazaki et al. | |
| 5,415,978 A | 5/1995 | Asami et al. | |
| 5,617,234 A | 4/1997 | Koga et al. | |
| 5,706,302 A | 1/1998 | Shimizu | |
| 5,832,015 A | 11/1998 | Goto et al. | |
| 6,126,311 A | 10/2000 | Schuh | |
| 6,253,097 B1 | 6/2001 | Aronow et al. | |
| 6,290,388 B1 | 9/2001 | Saul et al. | |
| 6,496,524 B2 | 12/2002 | Miyokawa et al. | |
| 6,501,774 B2 | 12/2002 | Kuwahara et al. | |
| 6,546,030 B2 | 4/2003 | Sasao | |
| 6,757,499 B1* | 6/2004 | Aoki ..................... | 398/182 |
| 6,804,116 B2* | 10/2004 | Owens et al. ............. | 361/700 |
| 6,807,206 B2 | 10/2004 | Tsukji et al. | |
| 6,934,448 B2 | 8/2005 | Akashi et al. | |
| 7,131,766 B2 | 11/2006 | Sultan et al. | |
| 7,154,372 B2 | 12/2006 | Vanha et al. | |
| 7,215,891 B1 | 5/2007 | Chiang et al. | |
| 2002/0105045 A1 | 8/2002 | Kawamura | |
| 2002/0167065 A1 | 11/2002 | Graf et al. | |
| 2003/0081289 A1* | 5/2003 | Oomori et al. ............. | 359/152 |
| 2003/0152390 A1* | 8/2003 | Stewart et al. ............. | 398/135 |
| 2003/0157741 A1 | 8/2003 | Oohata et al. | |
| 2003/0169984 A1* | 9/2003 | Chown .................... | 385/92 |
| 2006/0237807 A1 | 10/2006 | Hosking | |
| 2006/0239313 A1 | 10/2006 | Hosking | |
| 2006/0239314 A1 | 10/2006 | Hosking | |
| 2006/0239315 A1 | 10/2006 | Hosking | |

* cited by examiner

*Primary Examiner*—Daniel Petkovsek
(74) *Attorney, Agent, or Firm*—Workman Nydegger

(57) ABSTRACT

Optical subassemblies including optical transmit and receive subassemblies. The optical subassemblies comprise a housing; a substrate mounted within the housing; a thermoelectric cooler (TEC) thermally coupled to the substrate, the TEC being mounted within the housing; an optical component structurally mounted on the substrate, wherein the optical component is thermally coupled to the TEC; and a TEC driver electrically coupled to the TEC, wherein the TEC driver is configured to electrically drive the TEC, the TEC driver being mounted within the housing.

10 Claims, 7 Drawing Sheets

OPTOELECTRONIC SUBASSEMBLY WITH INTEGRAL THERMOELECTRIC COOLER DRIVER

CROSS-REFERENCE TO RELATED APPLICATIONS

This application claims the benefit of U.S. Provisional Application No. 60/986,356, filed Nov. 8, 2007, which is incorporated herein by reference in its entirety.

BACKGROUND

Computing and networking technology have transformed our world. As the amount of information communicated over networks has increased, high speed transmission has become ever more critical. Many high speed data transmission networks rely on optical transceivers and similar devices for facilitating transmission and reception of digital data embodied in the form of optical signals over optical fibers. Optical networks are thus found in a wide variety of high speed applications ranging from as modest as a small Local Area Network (LAN) to as grandiose as the backbone of the Internet.

Typically, data transmission in such networks is implemented by way of an optical transmitter (also referred to as an electro-optic transducer), such as a laser or Light Emitting Diode (LED). The laser emits light when current is passed through it, the intensity of the emitted light being a function of the current magnitude passed through the laser. Information is conveyed over an optical fiber by transmitting different optical intensities onto the fiber.

The laser has strong temperature dependencies that can seriously affect performance, depending on the application. For example, in Dense Wavelength Division Multiplexed (DWDM) laser applications, different optical channels are transmitted simultaneously, each optical channel having a tight frequency range that the corresponding optical signal should stay within. Any variance outside of the frequency range could cause inter-signal interference, seriously increasing the error rate of the transmission. Thus, in DWDM laser applications, it is critical that the laser's transmitted frequency be tightly controlled. Nevertheless, the frequency characteristics of a laser are heavily temperature-dependent. More specifically, the frequency characteristics of the optical emissions from the PN junction of the laser are heavily dependent on temperature. Thus, in DWDM laser applications, there is tight control of the temperature of the electro-optic transducer. Although DWDM has been discussed here, there are a wide variety of applications in which it may be desirable to accurately control the temperature of the emitting PN junction of the laser.

The temperature control of the laser typically relies on a temperature feedback system. Specifically, a temperature sensor is provided in proximity to the electro-optic transducer. Depending on the sensed temperature, a thermoelectric cooler (TEC) then heats or cools the temperature sensor as appropriate until the temperature sensor detects a temperature within an acceptable temperature range. The aim here is that by tightly controlling the temperature of the temperature sensor, the temperature of the proximate laser will also be tightly controlled.

Typically, the TEC is controlled by a TEC driver that is placed outside the subassembly housing containing the TEC, laser, and sensor. Accordingly, electrical connections must be made from the external TEC driver to the TEC inside the optical subassembly housing.

Such connections, while providing the necessary electrical signal to the TEC, have many disadvantages. For example, these connections require multiple high current, low impedance connections between the TEC and the TEC driver. Further, there are often Electro-Magnetic Interference (EMI) problems associated with these connections as the TEC driver output is often noisy. Finally, in many applications a large filtering component is required at the output of the TEC driver to control for signal impurities.

BRIEF SUMMARY

Embodiments disclosed herein relate to optical subassemblies including optical transmit and receive subassemblies. The optical subassemblies comprise a housing; a substrate mounted within the housing; a thermoelectric cooler (TEC) thermally coupled to the substrate, the TEC being mounted within the housing; an optical component structurally mounted on the substrate, wherein the optical component is thermally coupled to the TEC; and a TEC driver electrically coupled to the TEC, wherein the TEC driver is configured to electrically drive the TEC, the TEC driver being mounted within the housing.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teaching herein. The features and advantages of the teaching herein may be realized and obtained by means of the instruments and combinations particularly pointed out in the appended claims. These and other features will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Reference will now be made to figures wherein like structures will be provided with like reference designations. It is understood that the drawings are diagrammatic and schematic representations of exemplary embodiments of the invention, and are not limiting of the present invention nor are they necessarily drawn to scale. It is also understood that reference to a "first", or a "second", etc. element in this description and in the claims is meant to distinguish one element from another and is not meant to imply sequential ordering unless explicitly stated.

The principles of the present invention are related to optical transmitters, optical receivers, and optical transceivers suitable for 1 G, 2 G, 4 G, 8 G, 10 G, 40 G and higher bandwidth fiber channels. Furthermore, the principles of the present invention may be implemented in optical transmitters, optical receivers, and optical transceivers of any form factor such as XFP, SFP and SFF, without restriction.

An optical subassembly will first be described in some detail with respect to FIGS. 1 and 2. The optical subassembly is described by way of illustration only, and not by way of restricting the scope of the invention. For example, the principles of the present invention anticipate optical assemblies with additional components that are not illustrated in the enclosed figures. Further, the principles of the present invention anticipate optical subassemblies with components in other locations or having other dimensions than those disclosed herein.

Figure 1:
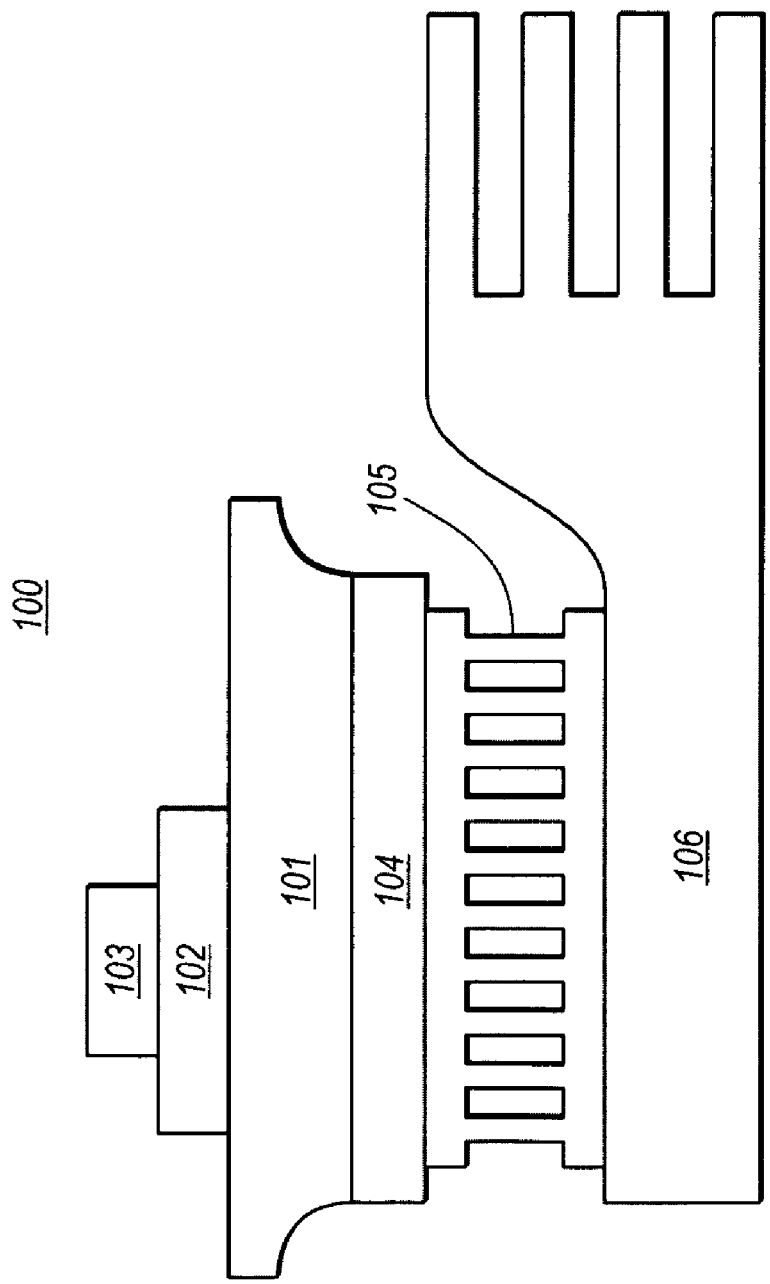
FIG. 1 illustrates a portion of an optical subassembly in which an optical component and temperature sensor are mounted on a substrate that includes a thermoelectric cooler (TEC) for controlling the temperature of the optical component and temperature sensor in accordance with the principles of the present invention.

FIG. 1 illustrates a portion 100 of an optical subassembly in which an optical component 103 is structurally mounted on a substrate 101. In the illustrated case, a temperature sensor 102 is structurally coupled between the optical component 103 and the substrate 101. This close proximity of the temperature sensor 102 to the optical component 103 reduces the thermal resistance between the temperature sensor 102 and the optical component 103, thereby facilitating more accurate temperature readings of the optical component 103. Of course it will be appreciated that in some embodiments the temperature sensor 102 may not be structurally coupled to the optical component 103 or may even not be implemented.

It will also be appreciated that in embodiments where the optical subassembly 100 is a transmitter subassembly, optical component 103 may be implemented as a laser or LED. Examples of lasers may include any reasonable laser such as, but not limited to, a VCSEL, a DBR, Fabry-Perot, or various other edge emitting lasers known to those of skill in the art.

In those embodiments where the optical subassembly 100 is a receiver subassembly, optical component 103 may be implemented as an optical detector or receiver. Examples of optical detectors or receivers include, but are not limited to, PIN and avalanche photodiodes. The optical detectors or receivers may further include sensors which are highly sensitive to temperature such as Germanium detectors, as well as a class of devices called solid state photomultipliers.

Returning to FIG. 1, a thermoelectric cooler (hereinafter simply referred to as a "TEC") 105 is shown thermally coupled to the substrate 101. In order to allow uniform heat transfer with the lower surface of the substrate 101, a thermally conductive piece 104 may be positioned between the TEC 105 and the substrate 101. A heat sink 106 is thermally coupled to the TEC 105. Note that there typically is no other heat generating components (such as a TEC driver circuit or other circuitry) mounted on the substrate 101.

Accordingly, there is high thermal resistance between the optical component 103/temperature sensor 102 combination and the surrounding heat generating circuitry. In addition, there is low thermal resistance between the temperature sensor 102 and the optical component 103. Both of these principles have the effect of allowing the temperature of the temperature sensor 102 to more closely track the temperature of the optical component 103. Accordingly, the TEC 105 may more tightly control the temperature of the optical component 103 by controlling the temperature of the temperature sensor 102. This allows for fine control of the frequencies emitted by the optical component 103 in some embodiments.

In addition, since there is high thermal resistance between the optical component 103/temperature sensor 102 combination and the surrounding heat generating circuitry, it takes less power for the TEC 105 to cool the optical component 103 to the appropriate temperature.

Figure 2:
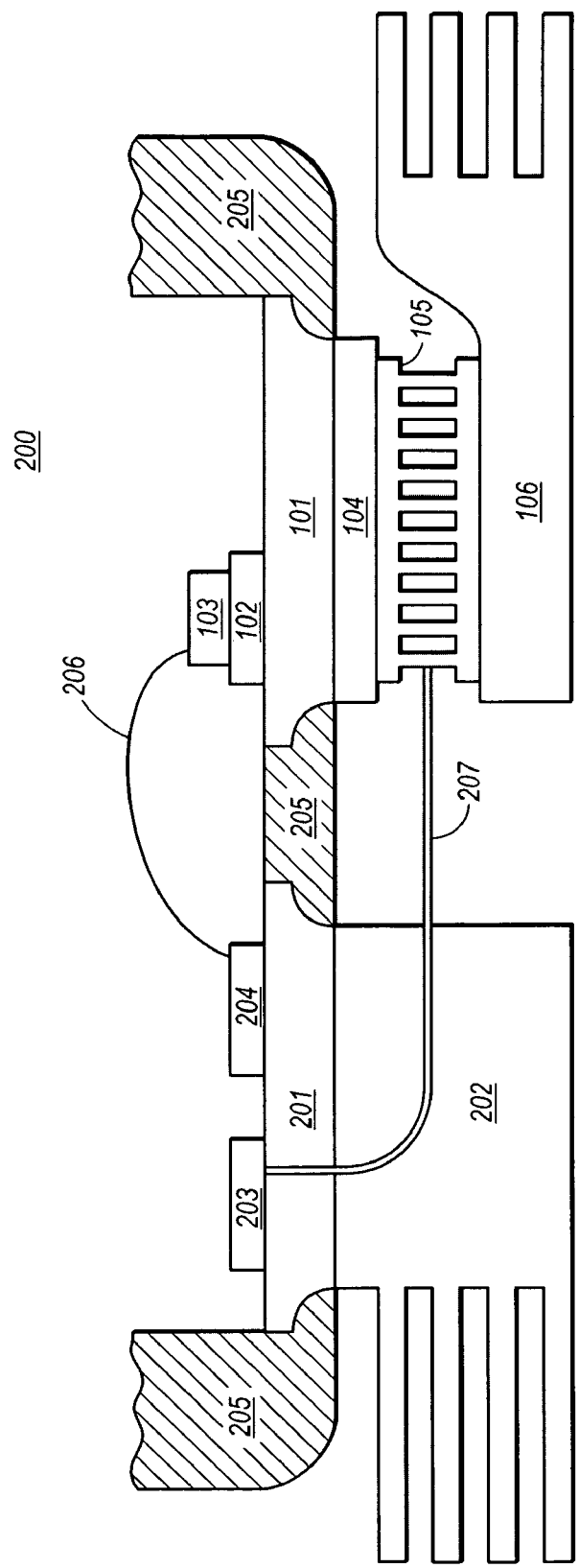
FIG. 2 illustrates a dual substrate optical subassembly that includes the portion of the optical subassembly of FIG. 1, and that further includes thermally isolated heat generating components mounted on a second substrate.

FIG. 2 illustrates an optical subassembly 200 that includes the portions described with respect to FIG. 1. In addition, the optical subassembly 200 includes a second substrate 201 that is thermally coupled to a heat sink 202. Heat generating components 203 and 204 are mounted on the second substrate 201. The heat generating components may include an electrical component 204 that is shown having an electrical connection 206 to the optical component 103. In those embodiments where optical component 103 is a laser, electrical component 204 may be a laser driver or like component. In those embodiments where optical component 103 is an optical detector or receiver, electrical component 204 may be a post-amplifier or like component.

In addition, a TEC driver 203 may also be mounted on the second substrate 201. As will be appreciated, there may be other heat generating components mounted on the second substrate 201 in addition to components 203 and 204.

The TEC driver 203 is configured to drive TEC 105 and is electrically coupled to TEC 105 by methods known in the art such as, but not limited to, wire bonding, solder, or printed circuit traces or any combination thereof as represented by electrical connection 207. An example of a TEC driver 203 that may be used to practice the principles of the present invention is the SSM2306 amplifier manufactured by Analog Device Corporation, doing business at One Technology Way, Norwood, Mass., 02062. Advantageously, this TEC driver is configured to drive one or two TECs 105, which is useful in some embodiments as will be explained in more detail to follow.

Figure 5:
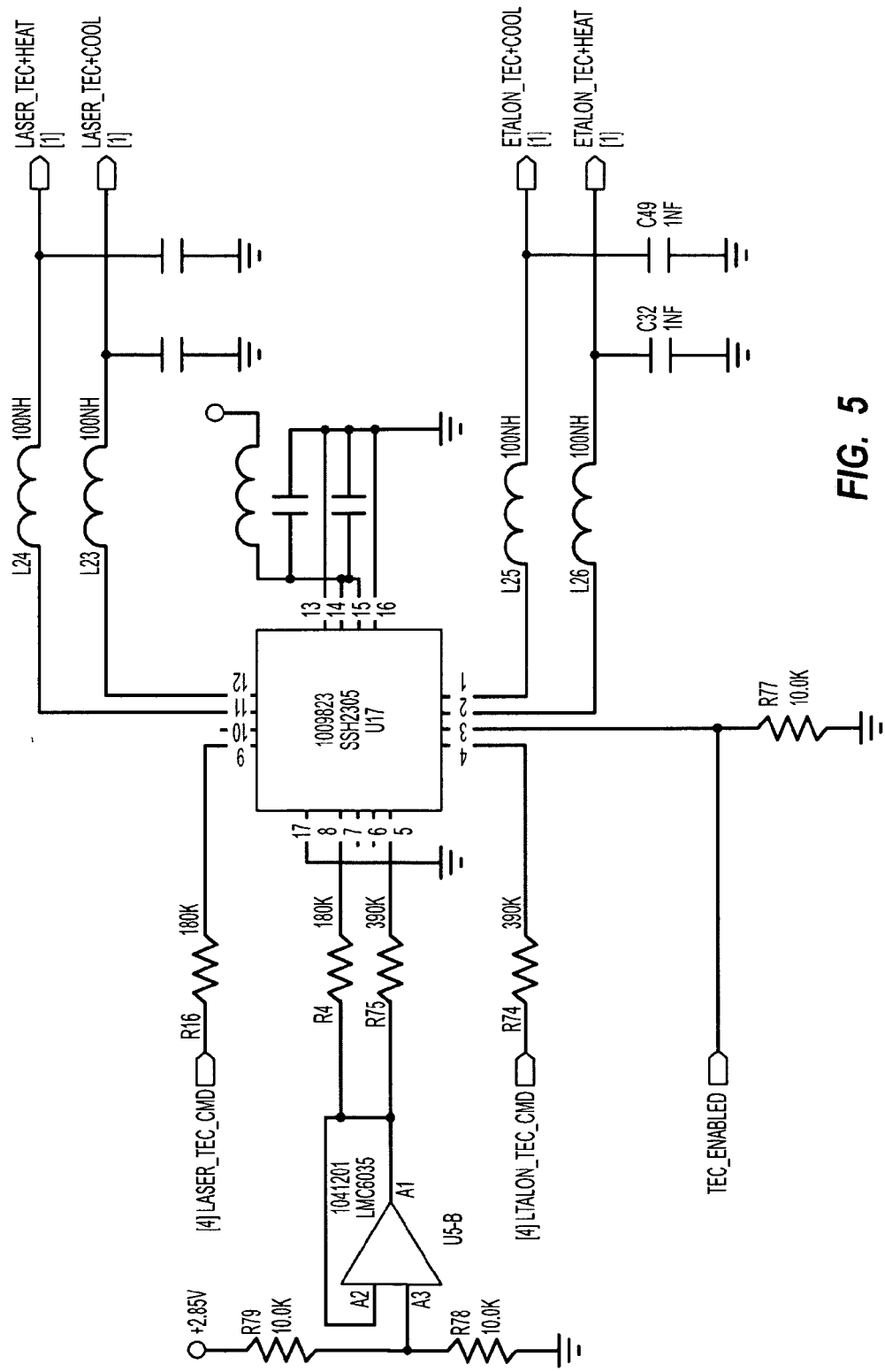
FIG. 5 illustrates an example TEC driver that may be implemented in accordance with the principles of the present invention.

Of course, one of skill in the art will appreciate that other example TEC drivers 203 may also be implemented. For example, FIG. 5 illustrates a circuit diagram of an alternative example embodiment of a TEC driver 203 that may be implemented according to the principles of the present invention.

Returning again to FIG. 2, a thermal resistance mechanism 205 provides thermal resistance between the first substrate 101 and the second substrate 201. For instance, the first and second substrates may be structurally bonded using any thermally insulating material. Accordingly, there is high thermal resistance between the heat generating circuitry and the laser. Furthermore, there is low thermal resistance through heat sink 202 between the heat generating circuitry and the environment. Thus, heat generated by the heat generating circuitry (i.e., components 203 and 204) has less effect on the temperature of the optical component 103.

Note that in some embodiments, electrical component 204 and TEC driver 203 may be mounted on separate substrates, which in turn are mounted on separate heat sinks. Such an embodiment provides for separate heat extraction regions for the electrical component and the TEC driver. In such embodiments, the various substrates holding electrical component 204, TEC driver 203, and optical component 103 may all be thermally isolated by thermal resistance mechanism 205 as previously described.

As mentioned previously, in conventional optical subassemblies the TEC driver 203 is mounted externally to the housing or enclosure of optical subassembly 200 and then coupled through the housing with TEC 105. Advantageously, the principles of the present invention allow for mounting TEC driver 203 in the optical subassembly 200 housing. This provides several advantages to typical optical subassembly designs. For example, mounting TEC driver 203 directly in the optical subassembly 200 housing at least partially reduces high current connections into the optical subassembly housing as the connections between the TEC driver 203 and TEC 105 are internal to the optical subassembly 200 housing. In addition, mounting the TEC driver 203 in the optical subassembly housing at least partially reduces EMI emissions as the TEC driver 203 is shielded by the optical subassembly housing. Further, placing the TEC driver 203 into the optical subassembly housing leaves additional room for other components on an external printed circuit board (FIG. 7) and also provides better heat management to the TEC driver 203.

Figure 3:
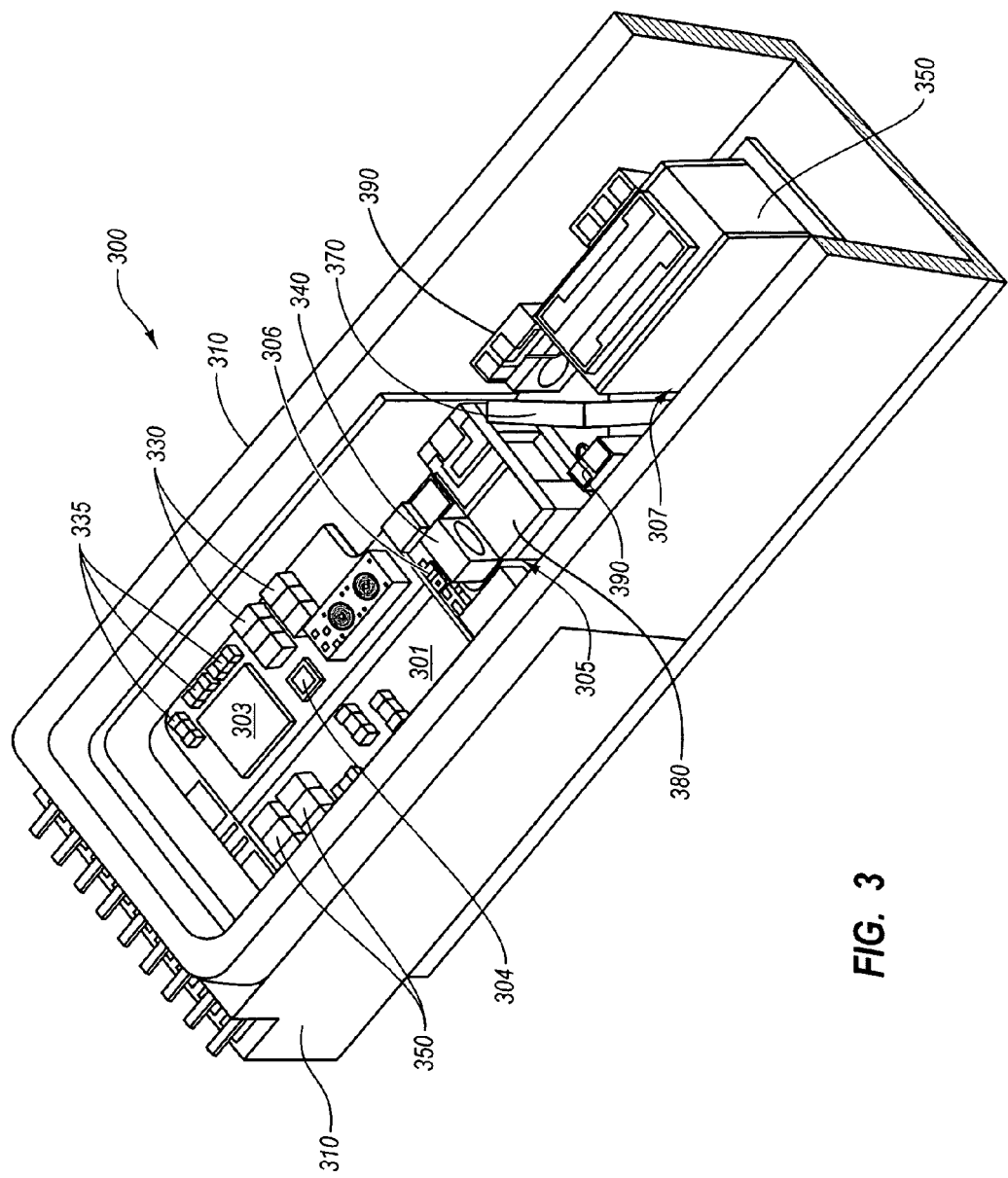
FIG. 3 illustrates a view of an optical subassembly that includes a TEC driver mounted inside the subassembly housing in accordance with the principles of the present invention.

Reference is now made to FIG. 3, which illustrate an isometric view of an optical transmit subassembly 300, which may correspond to optical subassembly 200 previously discussed. As shown, optical subassembly 300 includes a housing 310, which may be any reasonable optical subassembly housing. Housing 310 is configured to enclose the various components of the optical subassembly and may be constructed of any reasonable material. Although not shown, a shell can cooperate with the housing portion 310 to define a covering for the components of optical transmit assembly housed within housing 310. In some embodiments, housing 310 and the shell may be hermetically sealed.

Optical transmit subassembly 300 also includes a TEC driver 303 such as those previously described in relation to FIGS. 1 and 2. TEC driver 303 may be mounted on a substrate 301 as previously discussed. As shown, TEC driver 303 is mounted inside housing 310, which allows for the advantages previously described.

Optical transmit subassembly 300 also includes various other electrical components mounted on substrate 301. For example, various inductors 330 and capacitors 335 may be implemented as needed. One of skill in the art will appreciate that additional inductors, capacitors, and other electrical components may be also be mounted on substrate 301.

As further illustrated, optical transmit subassembly 300 also includes a laser driver 304. As explained previously, the laser driver 304 may also be mounted inside the housing 310, either on substrate 301 or on its own substrate. In still other embodiments, the laser drive may be mounted outside housing 310 as circumstance warrant.

Referring again to FIG. 3, optical transmit subassembly 300 further includes various optical components. For example, optical transmit subassembly 300 includes an optical transmitter or laser 306, which may correspond to optical component 103, mounted onto a TEC 305, which may correspond to TEC 105. Although not illustrated, a temperature sensor, such as temperature sensor 102, may also be coupled to laser 306 as previously described. In some embodiments, a lens structure 340, which is configured to aid in focusing light transmitted from the laser 306, may also be included.

In some embodiments, optical transmit assembly 300 may include an optical filter 350 that is mounted onto a second TEC 307. Optical filter 350 may be any reasonable filter structure and thus need not be further described. In some embodiments, optical filter 350 may be configured to increase the extinction ratio of an optical signal output by the laser 306. TEC 307 may correspond to TEC 105 previously discussed. A beam splitter 370 and an isolator 380 may also be included in some embodiments. As further illustrated, optical transmit assembly may include additional components 390 such as monitor photodiodes, thermistors, and the like.

Figure 4:
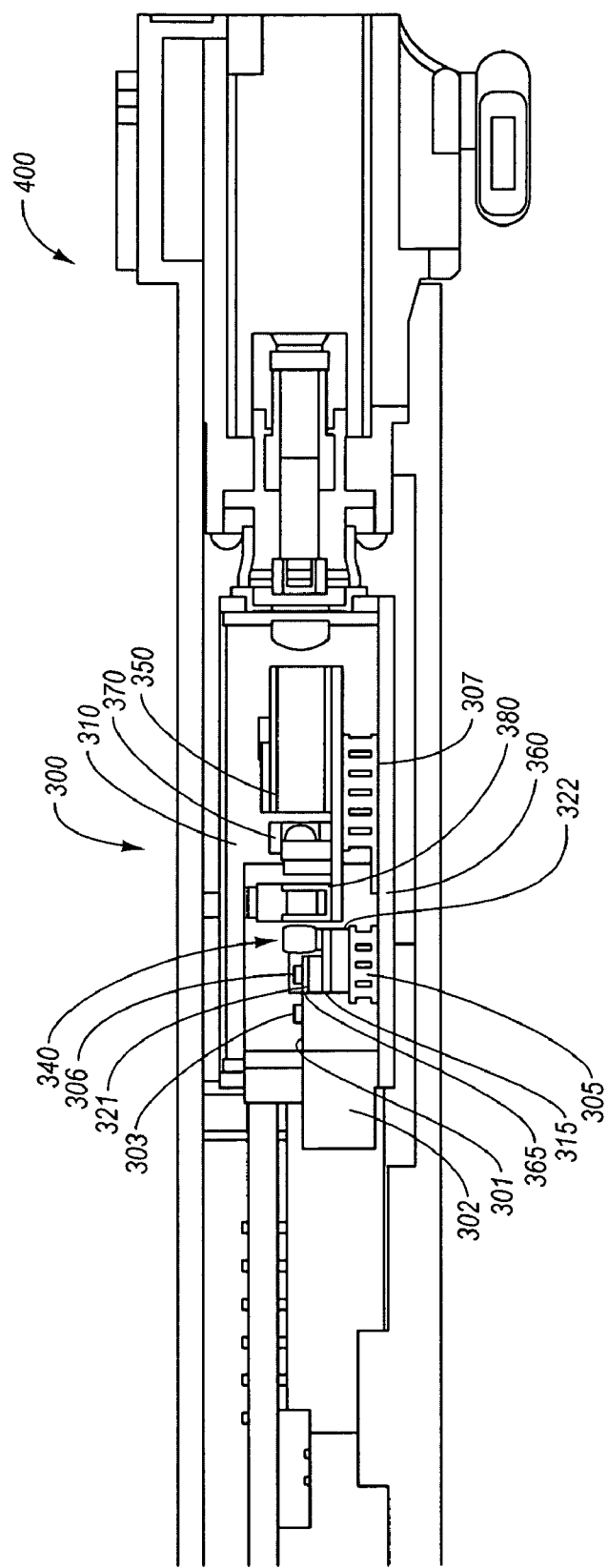
FIG. 4 illustrates a side view of the optical subassembly of FIG. 3 showing an optical component and temperature sensor mounted on a substrate that includes a thermoelectric cooler and the TEC driver inside the subassembly housing.

Turning now to FIG. 4, a cross section of an optical transceiver module 400 that includes optical transmit subassembly 300 is shown. Optical transceiver module 400 may be any optical transceiver as known in the art, a specific example of which will be explained in more detail to follow in relation to FIG. 7. Note that FIG. 4 will be discussed with reference to FIG. 3.

As illustrated, the various components of optical transmit subassembly 300 are enclosed by the housing 310. For example, TEC driver 303 is shown mounted onto the substrate 301, which is in turn mounted onto a heat sink 302, which may correspond to heat sink 202 as previously described.

As further illustrated in FIG. 4, laser 306 and lens assembly 340 are structurally mounted onto a substrate 315, which may correspond to substrate 101. As shown, a thermal mechanism 365, which may correspond to thermal mechanism 205, provides thermal resistance between substrates 301 and 315. A temperature sensor 321, which may correspond to temperature sensor 102, is structurally coupled between the laser 306 and the substrate 315. These components are in turn mounted onto TEC 305. In the illustrated embodiment, a thermally conductive piece 322, which may correspond to thermal conductive piece 104, is positioned between the TEC 305 and the substrate 315. As discussed above, TEC 305 is configured to provide thermal cooling and/or heating to the laser 306 and lens structure 340 as needed.

FIG. 4 also illustrates optical filter structure 350, beam splitter 370, and isolator 380. In the embodiment shown, optical filter 350 is mounted onto a TEC 307. TEC 307 may be mounted to heat sink 360, which may correspond to heat sink 106. In operation, TEC 307 is also driven by TEC driver 303.

Advantageously, implementing a TEC driver 303 with the ability to drive one or two TECs allows for both TECs 305 and 307 to be driven by the same TEC driver. Of course, it will be appreciated that in some embodiments a separate TEC driver may be implemented inside of subassembly housing 310 to drive each individual TEC. Implementing separate TEC drivers within subassembly housing 310 would still allow for the advantages previously described.

Although shown as sharing heat sink 360, TECs 305 and 307 may be mounted to their own respective heat sinks and may be thermally isolated from each other and/or other components of subassembly 300 by a thermal resistance mechanism, such as thermal resistance mechanism 205. Accordingly, in some embodiments there may be separate heat extraction regions for TEC driver 303, laser driver 304, TEC 305, and TEC 307 that are thermally isolated by thermal resistance mechanism as previously described or by some other reasonable mechanism.

Figure 6:
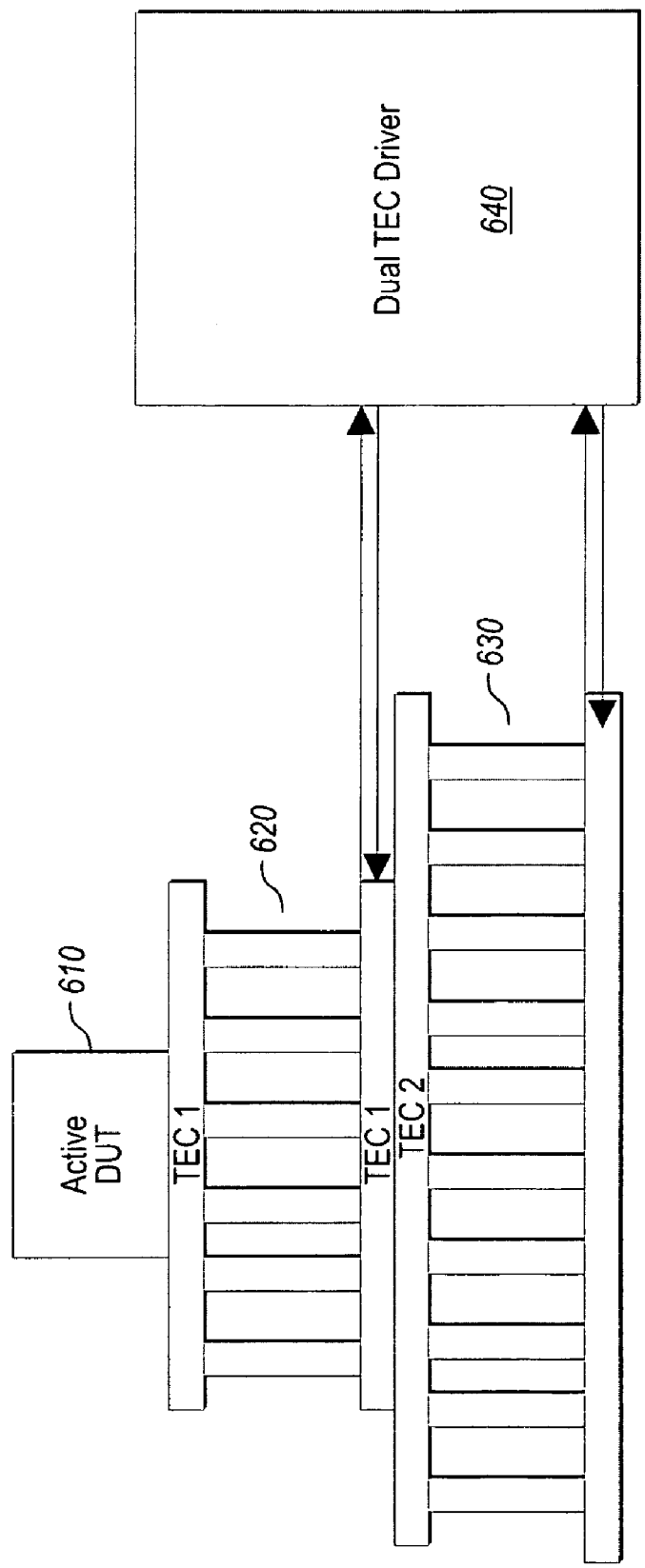
FIG. 6 illustrates an example embodiment implementing two stacked TECs driven by a single TEC driver.

Turning now to FIG. 6, an alternative embodiment of the principles of the present invention is illustrated. As shown in FIG. 6, in some embodiments two TECs 620 and 630, which may correspond to TECs 105 previously described, may be combined to provide super cooling to an electrical and/or optical component 610. In other words, the combination of TECs 620 and 630 provides more cooling than either TEC could alone. As shown, the two TECs 620 and 630 may be controlled by a single TEC driver 640, which may correspond to TEC driver 203 previously described. It will be appreciated that in some embodiments TEC driver 640 may be configured to control more than two TECs as circumstances warrant.

Figure 7:
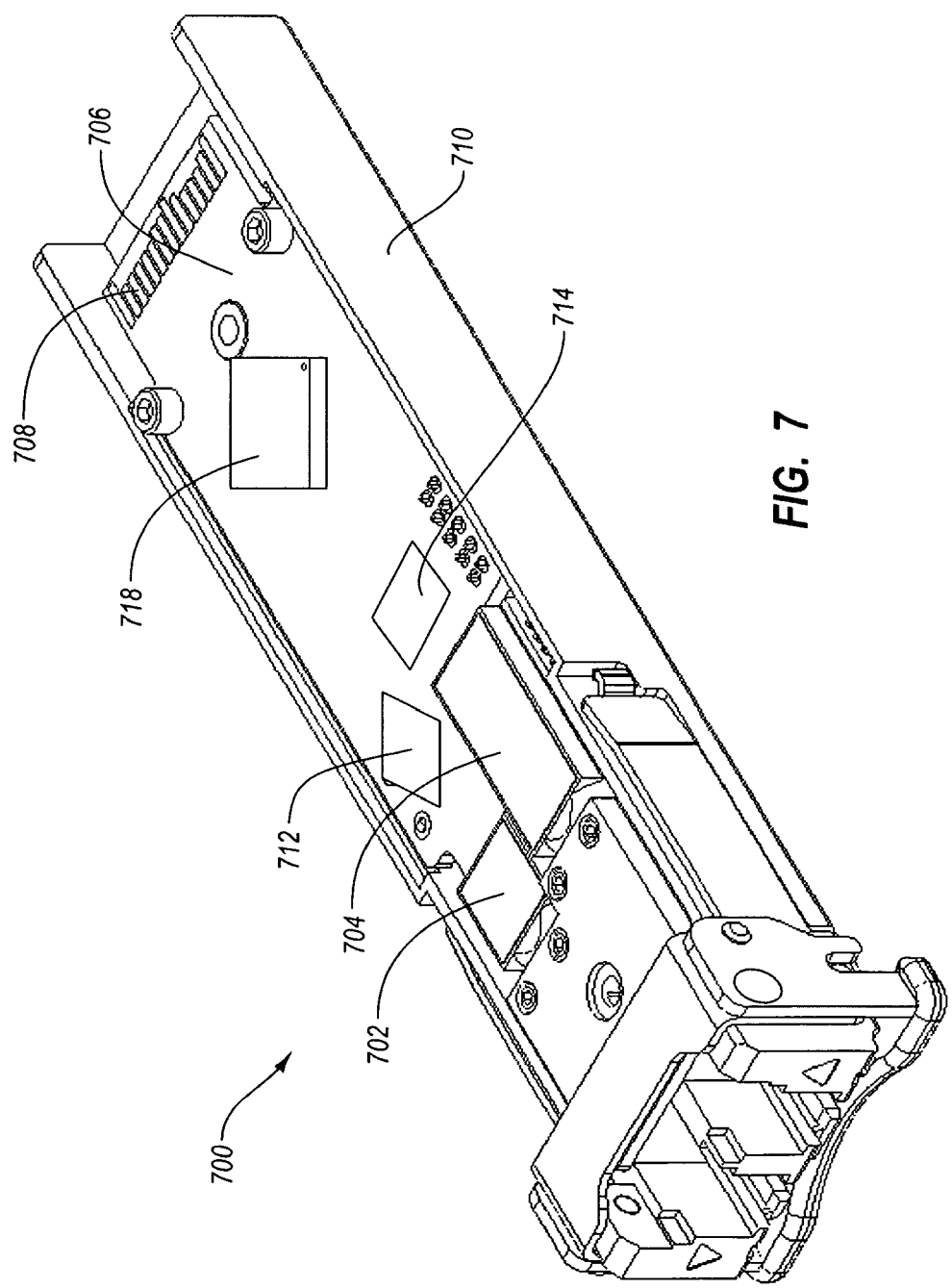
FIG. 7 illustrates an example optical transceiver in accordance with the principles of the present invention.

Turning to FIG. 7, an example optical transceiver 700 in which the principles of the present invention may be employed is illustrated. While the optical transceiver 700 will be described in some detail, the optical transceiver 700 is described by way of illustration only, and not by way of restricting the scope of the invention. As depicted, the transceiver shown in FIG. 7 includes various components, including a receiver optical subassembly ("ROSA") 702, a transmit optical subassembly ("ROSA") 704, and a printed circuit board 706. The ROSA 702 and TOSA 704 may correspond to the optical subassembly 200 previously discussed. In addition, TOSA 704 may correspond to transmit subassembly 300. The transceiver 700 may additionally include two flex circuits (not shown), one each used to electrically connect the ROSA 702 and the TOSA 704 to a plurality of conductive pads located on the PCB 706. An edge connector 708 is located on an end of the PCB 706 to enable the transceiver 700 to electrically interface with a host (not shown here). As such, the PCB 706 facilitates electrical communication between the ROSA 702/TOSA 704, and the host. In addition, the above-mentioned components of the transceiver 700 are partially housed within a housing portion 710. Though not shown, a shell can cooperate with the housing portion 710 to define a covering for the components of the transceiver 700. As illustrated in FIG. 7, PCB 706 includes circuitry and electronic components 712 and 714, for use with the TOSA 704 and ROSA 702 in performing the optical signal transmission and reception activities of the transceiver 700. Among the components included on some embodiments of the PCB 706 is a microcontroller 718.

Although the embodiments discussed herein were described in relation to optical subassemblies of optical transmitters, receivers, and transceivers, it will be appreciated that the principles of the present invention may be implemented with the electrical and/or optical components of other systems that are coupled to a TEC for cooling/heating purposes. For example, a TEC driver 203 may be implemented inside the same housing along with any electrical and/or optical components and the TEC. Accordingly, the principles of the present invention are not limited to optical subassemblies.

Accordingly, the principles of the present invention provide an optical subassembly in which the laser temperature may be more efficiently and tightly controlled. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. An optical subassembly comprising:
    a housing;
    a substrate mounted within the housing;
    a first thermoelectric cooler (TEC) thermally coupled to the substrate, the first TEC being mounted within the housing;
    a second TEC disposed in the optical subassembly, wherein the second TEC is disposed atop, and in direct contact with, the first TEC;
    an optical component structurally mounted on the substrate, wherein the optical component is thermally coupled to the first TEC; and
    a TEC driver electrically coupled to the first and second TECs, wherein the TEC driver is configured to electrically drive the first and second TECs, the TEC driver being mounted within the housing.

2. The optical subassembly in accordance with claim 1, wherein the substrate is a first substrate, the optical subassembly further comprising:
    a second substrate, wherein the TEC driver is structurally mounted on the second substrate.

3. The optical subassembly in accordance with claim 2, further comprising:
    a thermal resistance mechanism configured to provide thermal resistance between the first and second substrates.

4. The optical subassembly in accordance with claim 2, further comprising:
    an electrical component structurally mounted on the second substrate, the electrical component being electrically coupled to the optical component and being configured to either provide electrical signals to the optical component or to receive electrical signals from the optical component.

5. The optical subassembly in accordance with claim 2, wherein the first TEC is thermally coupled to a first heat sink and the second substrate is thermally coupled to a second heat sink.

6. The optical subassembly in accordance with claim 1, further comprising:
    a temperature sensor structurally coupled between the substrate and the optical component.

7. The optical subassembly in accordance with claim 1, further comprising:
    a thermal conductive piece structurally coupled between the first TEC and the substrate.

8. The optical subassembly in accordance with claim 1, wherein the optical component is one of an optical transmitter or an optical detector or receiver.

9. The optical subassembly in accordance with claim 1, wherein mounting the TEC driver in the subassembly housing at least partially reduces high current connections into the subassembly housing.

10. The optical subassembly in accordance with claim 1, wherein mounting the TEC driver in the subassembly housing at least partially reduces EMI emissions from the optical subassembly.

* * * * *